(12) United States Patent
Huang et al.

(10) Patent No.: US 11,355,426 B2
(45) Date of Patent: Jun. 7, 2022

(54) WIRING STRUCTURE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Min Lung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 2 days.

(21) Appl. No.: 16/945,429

(22) Filed: Jul. 31, 2020

(65) Prior Publication Data

US 2022/0037242 A1    Feb. 3, 2022

(51) Int. Cl.
| | | |
|---|---|---|
| H05K 1/02 | (2006.01) |
| H05K 1/11 | (2006.01) |
| H01L 23/498 | (2006.01) |
| H01L 21/48 | (2006.01) |
| H05K 1/03 | (2006.01) |
| H05K 1/18 | (2006.01) |

(52) U.S. Cl.
CPC ...... H01L 23/49822 (2013.01); H01L 21/486 (2013.01); H01L 21/4857 (2013.01); H01L 23/49838 (2013.01); H05K 1/0298 (2013.01); H05K 1/11 (2013.01); H05K 1/0313 (2013.01); H05K 1/18 (2013.01)

(58) Field of Classification Search
CPC ........... H01L 23/49822; H01L 21/4857; H01L 21/486; H01L 23/49838
See application file for complete search history.

(56) References Cited

U.S. PATENT DOCUMENTS

| | | | | |
|---|---|---|---|---|
| 5,191,174 A * | 3/1993 | Chang | ..................... | H05K 1/115 174/266 |
| 5,892,657 A * | 4/1999 | Inoue | ................... | H01L 25/0657 361/704 |
| 6,428,942 B1 * | 8/2002 | Jiang | ..................... | H01L 21/486 430/312 |
| 2016/0020163 A1 * | 1/2016 | Shimizu | ............ | H01L 23/49822 361/768 |
| 2019/0380212 A1 * | 12/2019 | Chien | .................. | H05K 3/0047 |

FOREIGN PATENT DOCUMENTS

JP         5655244 B2      1/2015

* cited by examiner

*Primary Examiner* — Ishwarbhai B Patel
(74) *Attorney, Agent, or Firm* — Foley & Lardner LLP

(57) ABSTRACT

A wiring structure and a method for manufacturing the same are provided. The wiring structure includes a conductive structure and at least one conductive through via. The conductive structure includes a plurality of dielectric layers, a plurality of circuit layers in contact with the dielectric layers, and a plurality of dam portions in contact with the dielectric layers. The dam portions are substantially arranged in a row and spaced apart from one another. The conductive through via extends through the dam portions.

17 Claims, 20 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive through via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a conductive structure and at least one conductive through via. The conductive structure includes a plurality of dielectric layers, a plurality of circuit layers in contact with the dielectric layers, and a plurality of dam portions in contact with the dielectric layers. The dam portions are substantially arranged in a row and spaced apart from one another. The conductive through via extends through the dam portions.

In some embodiments, a wiring structure includes a lower conductive structure, an upper conductive structure and at least one conductive through via. The lower conductive structure includes at least one dielectric layer and at least one circuit layer in contact with the dielectric layer. The upper conductive structure is disposed on the lower conductive structure. The upper conductive structure includes a plurality of dielectric layers, a plurality of circuit layers in contact with the dielectric layers, and a plurality of dam portions in contact with the dielectric layers. The dam portions are substantially arranged in a row and spaced apart from one another. The conductive through via extends through the dam portions and the upper conductive structure, and terminates on the circuit layer of the lower conductive structure.

In some embodiments, a method for manufacturing a wiring structure includes: (a) providing a lower conductive structure including at least one dielectric layer and at least one circuit layer in contact with the dielectric layer; (b) providing an upper conductive structure including a plurality of dielectric layers, a plurality of circuit layers in contact with the dielectric layers, and a plurality of dam portions in contact with the dielectric layers, wherein the dam portions are substantially arranged in a row and spaced apart from one another; (c) attaching the upper conductive structure to the lower conductive structure; and (d) forming at least one conductive through via to extend through the dam portions of the upper conductive structure and contact the circuit layer of the lower conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
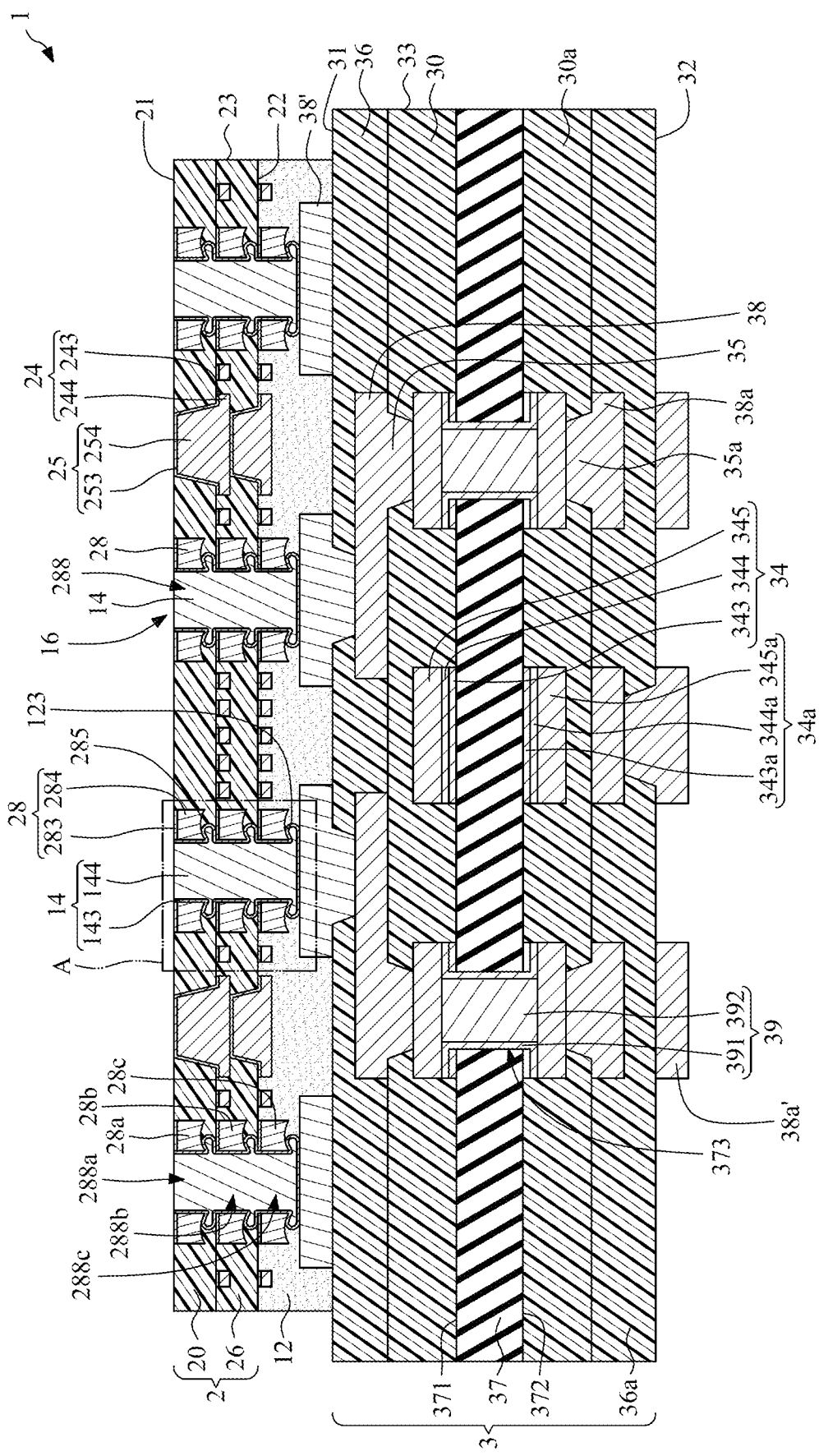
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
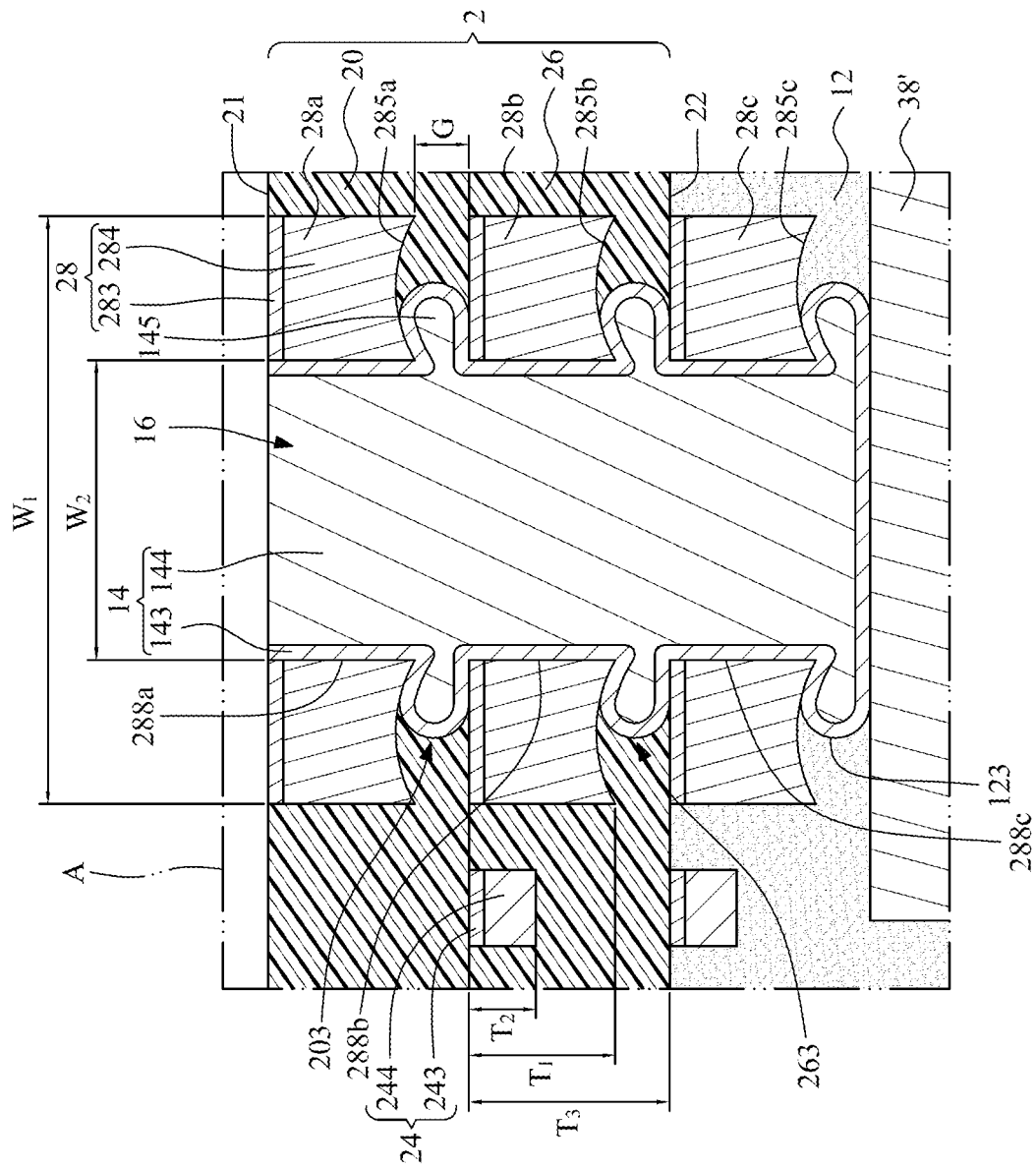
FIG. 2 illustrates a partially enlarged view of a region "A" in FIG. 1.

FIG. 1 illustrates a cross-sectional view of a wiring structure 1 according to some embodiments of the present disclosure. FIG. 2 illustrates a partially enlarged view of a region "A" in FIG. 1. The wiring structure 1 may include an upper conductive structure (e.g., a conductive structure) 2 and at least one conductive through via 14. In some embodiments, the wiring structure 1 may further include an intermediate layer 12 and a lower conductive structure 3.

The upper conductive structure 2 is disposed on the lower conductive structure 3, and includes a plurality of dielectric layers (including, for example, a first dielectric layer 20 and a second dielectric layer 26), a plurality of circuit layers 24 (formed of a metal, a metal alloy, or other conductive material) in contact with the dielectric layers 20, 26, a plurality of dam portions 28 (formed of a metal, a metal alloy, or other conductive material) in contact with the dielectric layers 20, 26, and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layers 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the dielectric layers 20, 26 are stacked on one another. For example, the first dielectric layer 20 may be the topmost dielectric layer. In some embodiments, a material of the dielectric layers 20, 26 is transparent, and can be seen through or detected by human eyes or machine. In some embodiments, a transparent material of the dielectric layers 20, 26 has a light transmission for a wavelength in the visible range (or other pertinent wavelength for detection of a mark) of at least about 60%, at least about 70%, or at least about 80%. In some embodiments, a material of the dielectric layers 20, 26 may be made of a cured photoimageable dielectric (PID) material such as epoxy or polyimide (PI) including photoinitiators.

The circuit layers 24 may be fan-out circuit layers or redistribution layers (RDLs), and an L/S of the circuit layers 24 may be less than about 10 μm/10 μm, less than or equal to 8 μm/8 μm, less than or equal to 5 μm/5 μm less than or equal to 3 μm/3 μm less than or equal to about 2 μm/about 2 μm or less than or equal to about 1.8 μm/about 1.8 μm. In some embodiments, the circuit layer 24 is embedded in the corresponding dielectric layers 20, 26. In some embodiments, each circuit layer 24 may include a seed layer 243 and a conductive material 244 (e.g., a plating metallic material) disposed on the seed layer 243. As shown in FIG. 1, the bottommost circuit layer 24 is disposed on and protrudes from the bottom surface 22 of the upper conductive structure 2 (e.g., the bottom surface of the second dielectric layer). As illustrated in the embodiment of FIG. 1, a horizontally connecting or extending circuit layer is omitted in the first dielectric layer 20.

Some of the inner conductive vias 25 are disposed between two adjacent circuit layers 24 for electrically connecting the two circuit layers 24. Some of the inner conductive vias 25 are exposed from the top surface 21 of the upper conductive structure 2 (e.g., the top surface of the first dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

As shown in FIG. 1 and FIG. 2, the dam portions 28 may include a first dam portion 28a, a second dam portion 28b and a third dam portion 28c. The dam portions 28 (e.g., the first dam portion 28a, the second dam portion 28b and the third dam portion 28c) are in contact with the dielectric layers 20, 26, and the dam portions 28 are substantially arranged in a row and spaced apart from one another. That is, the dam portions 28 may not contact each other, and there is a gap G between two adjacent dam portions 28. In some embodiments, a portion of the dielectric layers 20, 26 may be disposed in the gap G between two adjacent dam portions 28. In addition, the dam portions 28 may be substantially aligned with one another.

In some embodiments, each of the dielectric layers 20, 26 may define a recess portion 203, 263 in the gap G. For example, the first dielectric layer 20 may define a recess portion 203 in the gap G between the first dam portion 28a and the second dam portion 28b. The second dielectric layer 26 may define a recess portion 263 in the gap G between the second dam portion 28b and the third dam portion 28c. Each of the sidewalls of the recess portion 203, 206 may be curved.

In some embodiments, each of the dam portions 28 may include a seed layer 283 and a conductive material 284 (e.g., a plating metallic material such as copper) disposed on the seed layer 283. The conductive material 284 may not taper. Thus, a periphery side surface of the dam portion 28 may be perpendicular to a surface (e.g., a top surface or a bottom surface) of the dielectric layers 20, 26. The dam portion 28 may have a substantially consistent width $W_1$. The width $W_1$ may be the maximum width $W_1$ of the dam portion 28, and may be less than or equal to 30 μm, less than or equal to 25 μm, or less than or equal to 20 μm. In some embodiments, at least one of the dam portions 28 may be electrically connected to a respective one of the circuit layers 24. However, in other embodiments, all of the dam portions 28 may be electrically isolated from the circuit layers 24.

As shown in FIG. 1, a thickness of the dam portion 28 is greater than a thickness of the circuit layer 24, and is less than a thickness of the dielectric layer 20, 26. As shown in FIG. 2, a thickness T1 of the second dam portion 28b is greater than a thickness T2 of the circuit layer 24, and is less than a thickness T3 of the second dielectric layer 26. In some embodiments, the dam portions 28 may include a concave portion (or a concave surface) 285 on an end (e.g., bottom end) thereof, and the dielectric layer 20, 26 covers the concave portion 285. For example, the first dam portions 28a may include a concave portion 285a, and the first dielectric layer 20 covers the concave portion 285a. The second dam portions 28b may include a concave portion 285b, and the second dielectric layer 26 covers the concave portion 285b.

As shown in FIGS. 1 and 2, each of the dam portions 28 (e.g., the first dam portion 28a, the second dam portion 28b, and the third dam portion 28c) may be in a substantially closed ring shape, and may define a through hole 288. For example, from a top view or a bottom view, the dam portion 28 may be a circular ring or a rectangular ring. Each of the through holes 288 may have a substantially consistent width $W_2$. The width $W_2$ may be less than or equal to 20 less than or equal to 15 μm, or less than or equal to 10 μm. In some embodiments, the first dam portion 28a may define a through hole 288a, the second dam portion 28b may define a through hole 288b, and the third dam portion 28c may define a through hole 288c.

The dam portions 28 (including the first dam portion 28a, the second dam portion 28b and the third dam portion 28c and the dielectric layers 20, 26 may define an accommodating hole 16. That is, the accommodating hole 16 includes the through holes 288 (including the through holes 288a, 288b, 288c) of the stacked dam portions 28 (including the first dam portion 28a, the second dam portion 28b and the third dam portion 28c) and the recess portions 203, 263 of the dielectric layers 20, 26. As shown in FIG. 2, the accommodating hole 16 is a single hole that extends through all of the dam portions 28 (including the first dam portion 28a, the second dam portion 28b and the third dam portion 28c), and extends through the upper conductive structure 2. Further, an inner surface of the accommodating hole 16 may be not a continuous or smooth surface since the recess portions 203, 263 of the dielectric layers 20, 26 may be curved.

The conductive through via 14 is disposed in and fills the accommodating hole 16. That is, the conductive through via 14 is disposed in and fills the through holes 288 (including the through holes 288a, 288b, 288c, 288d) of the dam portions 28 (including the first dam portion 28a, the second dam portion 28b and the third dam portion 28c) and the recess portions 203, 263 of the dielectric layers 20, 26. Alternatively, a portion (e.g., a protrusion portion 145) of the conductive through via 14 may extend into the recess portions 203, 263 of the dielectric layers 20, 26. That is, the portion (e.g., the protrusion portion 145) of the conductive through via 14 may be disposed between two adjacent dam portions 28.

The conductive through via 14 extends through and contacts the dam portions 28 (including the first dam portion 28a, the second dam portion 28b and the third dam portion 28c) and the dielectric layers 20, 26. The conductive through via 14 may be a monolithic or one-piece structure. A lateral side surface of the conductive through via 14 may be not a continuous or smooth surface since the inner surface of the accommodating hole 16 may be not a continuous or smooth surface. In some embodiments, the conductive through via 14 may include a seed layer 143 and a conductive material 144 (e.g., a plating metallic material such as copper). The seed layer 143 is interposed between the conductive material 144 of the conductive through via 14 and the dam portions 28, and a portion of the seed layer 143 is disposed in the recess portions 203, 206. In some embodiments, the conductive material 144 of the conductive through via 14 may be different from the conductive material 284 of the dam portion 28. For example, the conductive material 144 of the conductive through via 14 may include copper-iron composite, and the conductive material 284 of the dam portion 28 may include copper sulfate. In addition, a lattice of the conductive material 144 of the conductive through via 14 may be different form a lattice of the conductive material 284 of the dam portion 28. A grain size of the conductive material 144 of the conductive through via 14 may be greater than a grain size of the conductive material 284 of the dam portion 28.

Since the conductive through via 14 is defined and limited by the dam portions 28, a maximum width of a final conductive via constituted by the conductive through via 14 and the dam portions 28 is equal to the maximum width $W_1$ of the dam portion 28. As shown in FIG. 2, the sizes of the dam portions 28 may be substantially same as each other, and the widths $W_2$ of the through holes 288 of the dam portions 28 may be substantially equal to each other.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37. The lower conductive structure 3 may be also referred to as "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31, a bottom surface 32 opposite to the top surface 31, and a lateral surface 33 extending between the top surface 31 and the bottom surface 32. The lower conductive structure 3 may include a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 1, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit the insulation material 392, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30a is disposed on the bottom surface 372 of the core portion 37. The second lower dielectric layer 36a is stacked or disposed on the first lower dielectric layer 30a.

A thickness of each of the dielectric layers 20, 26 of the upper conductive structure 2 is less than or equal to about 40%, less than or equal to about 35%, or less than or equal to about 30% of a thickness of each of the dielectric layers 30, 36, 30a, 36a of the lower conductive structure 3. For example, a thickness of each of the dielectric layers 20, 26 of the upper conductive structure 2 may be less than or equal to about 7 μm, and a thickness of each of the dielectric layers 30, 36, 30a, 36a of the lower conductive structure 3 may be about 40 μm. In addition, a material of the dielectric layers 30, 36, 30a, 36a of the lower conductive structure 3 may be different from the material of the dielectric layers 20, 26 of the upper conductive structure 2. For example, the material of the dielectric layers 30, 36, 30a, 36a of the lower conductive structure 3 may be polypropylene (PP) or ajinomoto build-up film (ABF).

An L/S of the first upper circuit layer 34 may be greater than or equal to about 10 μm/about 10 μm. Thus, the L/S of the first upper circuit layer 34 may be greater than or equal to about five times the L/S of the circuit layers 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the circuit layers 24 of the upper conductive structure 2. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface of the second upper dielectric layer 36. In some embodiments, the second upper circuit layer 38 is electrically connected to the second upper circuit layer 38' through the upper interconnection vias 35. In some embodiments, the second upper circuit layer 38' is the topmost circuit layer of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the circuit layers 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the circuit layers 24 of the upper conductive structure 2. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material). Thus, the third dam portion 28c and the bottommost circuit layer 24 of the upper conductive structure 2 and the topmost circuit layer (e.g., the second upper circuit layer 38') of the lower conductive structure 3 are embedded in the intermediate layer 12. In some embodiments, a bonding force between two adjacent dielectric layers 20, 26 of the upper conductive structure 2 is greater than a bonding force between the second dielectric layer 26 of the upper conductive structure 2 and the intermediate layer 12. A surface roughness of a boundary between two adjacent dielectric layers 20, 26 of the upper conductive structure 2 is greater than a surface roughness of a boundary between a dielectric layer (e.g., the second dielectric layer 26) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. In addition, the material of the intermediate layer 12 may be different from the material of the dielectric layers 30, 36, 30a, 36a of the lower conductive structure 3 and the material of the dielectric layers 20, 26 of the upper conductive structure 2. For example, the material of the intermediate layer 12 may be ABF, or ABF-like dielectric film.

The intermediate layer 12 defines at least one through hole 123. In some embodiments, the through hole 123 of the intermediate layer 12 extends through the upper conductive structure 2 and terminates at or on a topmost circuit layer (e.g., the second upper circuit layer 38') of the lower conductive structure 3. In some embodiments, the sidewall of the through hole 123 of the intermediate layer 12 may be curved since it may be formed by plasma. The through hole 123 of the intermediate layer 12 may expose a portion of the topmost circuit layer (e.g., a top surface of the second upper circuit layer 38') of the lower conductive structure 3.

As shown in FIG. 1, the through hole 123 of the intermediate layer 12 may be aligned with and in communication with the accommodating hole 16 of the upper conductive structure 2 for accommodating the conductive through via 14. Thus, a bottom portion of the conductive through via 14 may be disposed in the through hole 123 of the intermediate layer 12. The conductive through via 14 may further extend through the through hole 123 of the intermediate layer 12, and is electrically connected to the topmost circuit layer (e.g., the top surface of the second upper circuit layer 38') of the lower conductive structure 3. The conductive through via 14 extends from the top surface 21 of the upper conductive structure 2 to the bottom surface of the intermediate layer 12 to terminate at or on a portion of the topmost circuit layer (e.g., the top surface of the second upper circuit layer 38') of the lower conductive structure 3. Thus, a length of the conductive through via 14 is greater than a thickness of the upper conductive structure 2. In some embodiments, the upper conductive structure 2 is electrically connected to the lower conductive structure 3 only through the conductive through via 14.

As shown in the embodiment illustrated in FIG. 1 and FIG. 2, the wiring structure 1 is a combination of the upper conductive structure 2 and the lower conductive structure 3, in which the circuit layers 24 of the upper conductive structure 2 has fine pitch, high yield and low thickness; and the circuit layers (for example, the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. The manufacturing yield for one layer of the circuit layers 24 of the upper conductive structure 2 may be 99%, and the manufacturing yield for one layer of the circuit layers (for example, the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. Thus, the warpage of the lower conductive structure 3 will not be accumulated onto the warpage of the upper conductive structure 2. Thus, the yield of the wiring structure 1 may be further improved.

In addition, during the manufacturing process, the accommodating hole 16 (including the through holes 288 of the dam portions 28) of the upper conductive structure 2 may be formed by removing portions of the dielectric layers 20, 26 in the through holes 288 of the dam portions 28 by plasma. Thus, a width and a profile of the accommodating hole 16 are defined and limited by the solid portions of the dam portions 28. As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Figure 3:
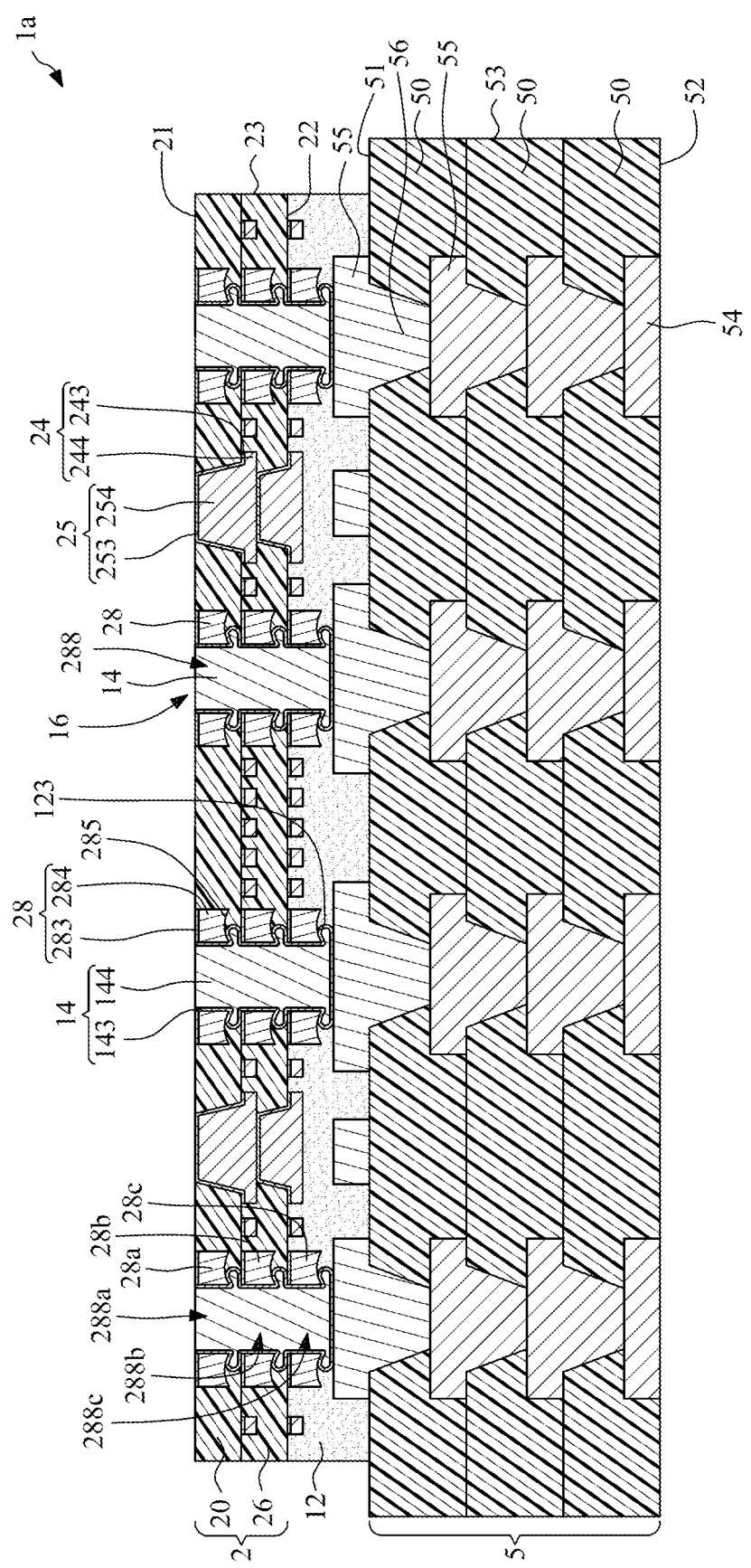
FIG. 3 illustrates a cross-sectional view of a wiring structure according to some embodiments of the present disclosure.

FIG. 3 illustrates a cross-sectional view of a wiring structure 1a according to some embodiments of the present disclosure. The wiring structure 1a is similar to the wiring structure 1 shown in FIG. 1, except for a structure of the lower conductive structure 5. As shown in FIG. 3, the lower conductive structure 5 may be a coreless substrate, and may include at least one dielectric layer (including, for example, three dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). As shown in FIG. 3, the lower conductive structure 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower conductive structure 5. In some embodiments, the lateral surface 23 of the upper conductive structure 2 may be substantially coplanar with the lateral surface 53 of the lower conductive structure 5.

The lower circuit layer 54 is embedded in the bottommost dielectric layer 50, and exposed from the bottom surface of the bottommost dielectric layer 50. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower conductive structure 5. Thus, a tapering direction of the inner conductive via 56 of the lower conductive structure 5 is different from the tapering direction of the inner conductive via 25 of the upper conductive structure 2.

A thickness of each of the dielectric layers 20, 26 of the upper conductive structure 2 is less than or equal to about 40%, less than or equal to about 35%, or less than or equal to about 30% of a thickness of each of the dielectric layers 50 of the lower conductive structure 5. In addition, a material of the dielectric layers 50 of the lower conductive structure 5 may be different from the material of the dielectric layers 20, 26 of the upper conductive structure 2. For example, the material of the dielectric layers 50 of the lower conductive structure 5 may be polypropylene (PP) or ajinomoto build-up film (ABF).

An L/S of the upper circuit layer 55 and the lower circuit layer 54 may be greater than or equal to about 10 μm/about 10 μm. Thus, the L/S of the upper circuit layer 55 and the lower circuit layer 54 may be greater than or equal to about five times the L/S of the circuit layers 24 of the upper conductive structure 2. In addition, in some embodiments, the topmost upper circuit layer 55 is disposed on and protrudes from the top surface of the topmost dielectric layer 50 (i.e., the top surface 51 of the lower conductive structure 5).

The intermediate layer 12 is interposed or disposed between the upper conductive structure 5 and the lower conductive structure 3 to bond the upper conductive structure 5 and the lower conductive structure 3 together. In addition, the material of intermediate layer 12 may be different from the material of the dielectric layers 50 the lower conductive structure 5. The conductive through via 14 may extend through the intermediate layer 12, and is electrically connected to the topmost upper circuit layer 55 of the lower conductive structure 5.

Figure 4:
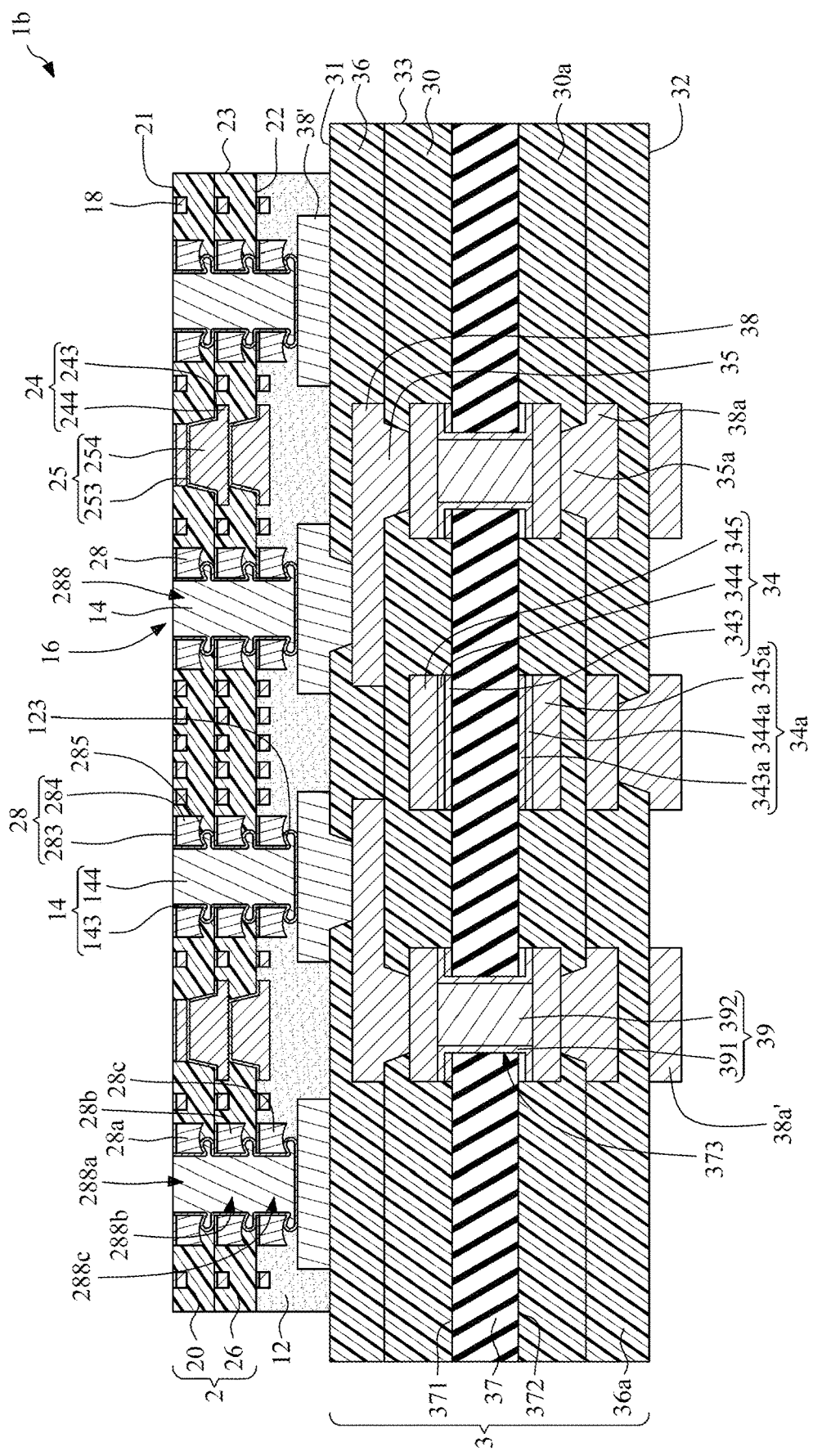
FIG. 4 illustrates a cross-sectional view of a wiring structure according to some embodiments of the present disclosure.

FIG. 4 illustrates a cross-sectional view of a wiring structure 1b according to some embodiments of the present disclosure. The wiring structure 1b is similar to the wiring structure 1 shown in FIG. 1, except that an outer circuit layer 18 is further included. The outer circuit layer 18 is embedded in the first dielectric layer 20 and is exposed from the top surface 21 of the upper conductive structure 2. The topmost inner conductive vias 25 of the upper conductive structure 2 are electrically connected to or contact a portion of the outer circuit layer 18.

Figure 5:
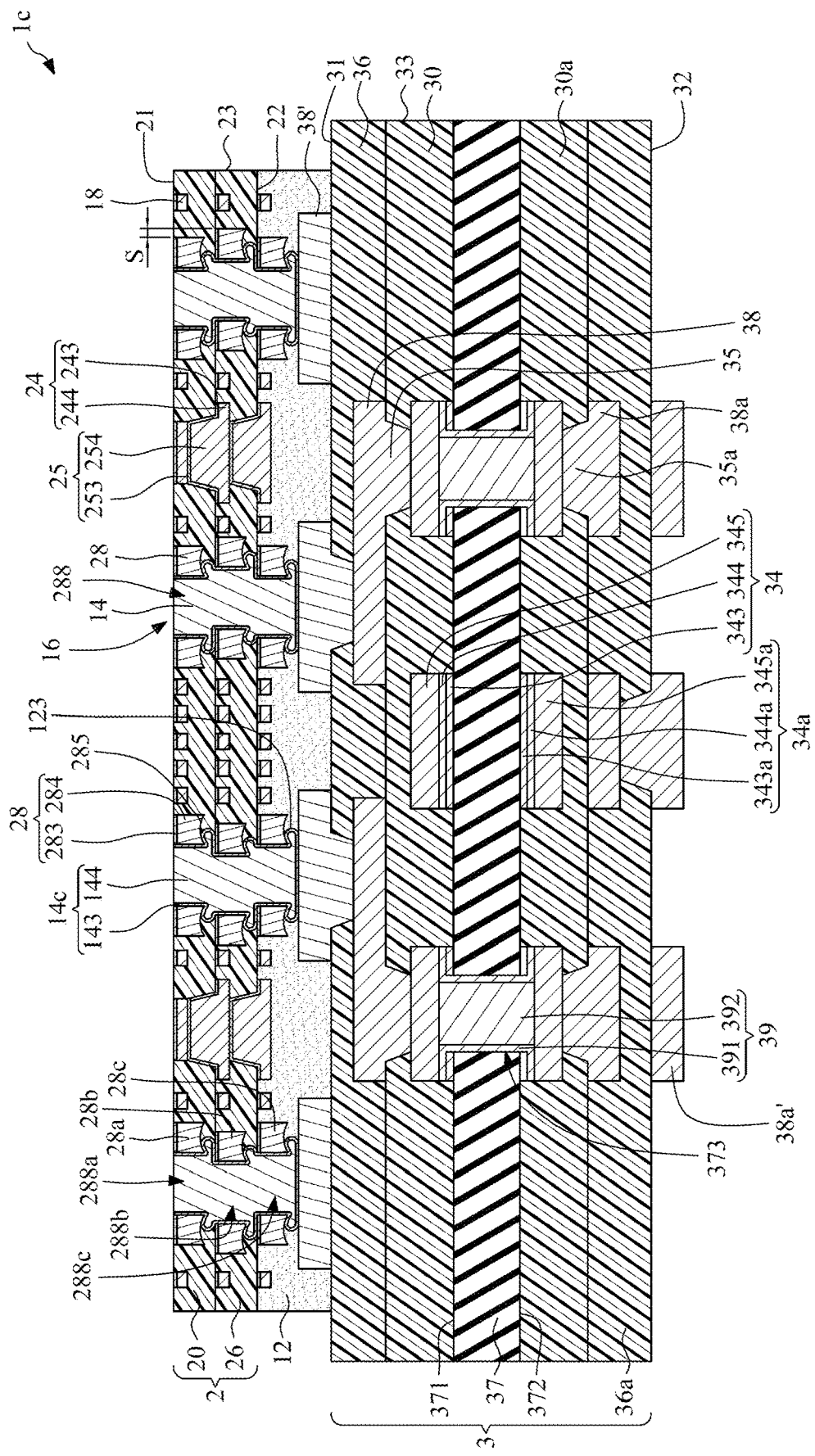
FIG. 5 illustrates a cross-sectional view of a wiring structure according to some embodiments of the present disclosure.

FIG. 5 illustrates a cross-sectional view of a wiring structure 1c according to some embodiments of the present disclosure. The wiring structure 1c is similar to the wiring structure 1b shown in FIG. 4, except for a structure of the conductive through via 14c. As shown in FIG. 5, the dam portions 28 are misaligned with one another. A shift S is formed between two adjacent ones of the dam portions 28. For example, there may be a shift S between the first dam portion 28a and the second dam portion 28b. Further, there may be a shift S between the second dam portion 28b and the third dam portion 28c.

Figure 6:
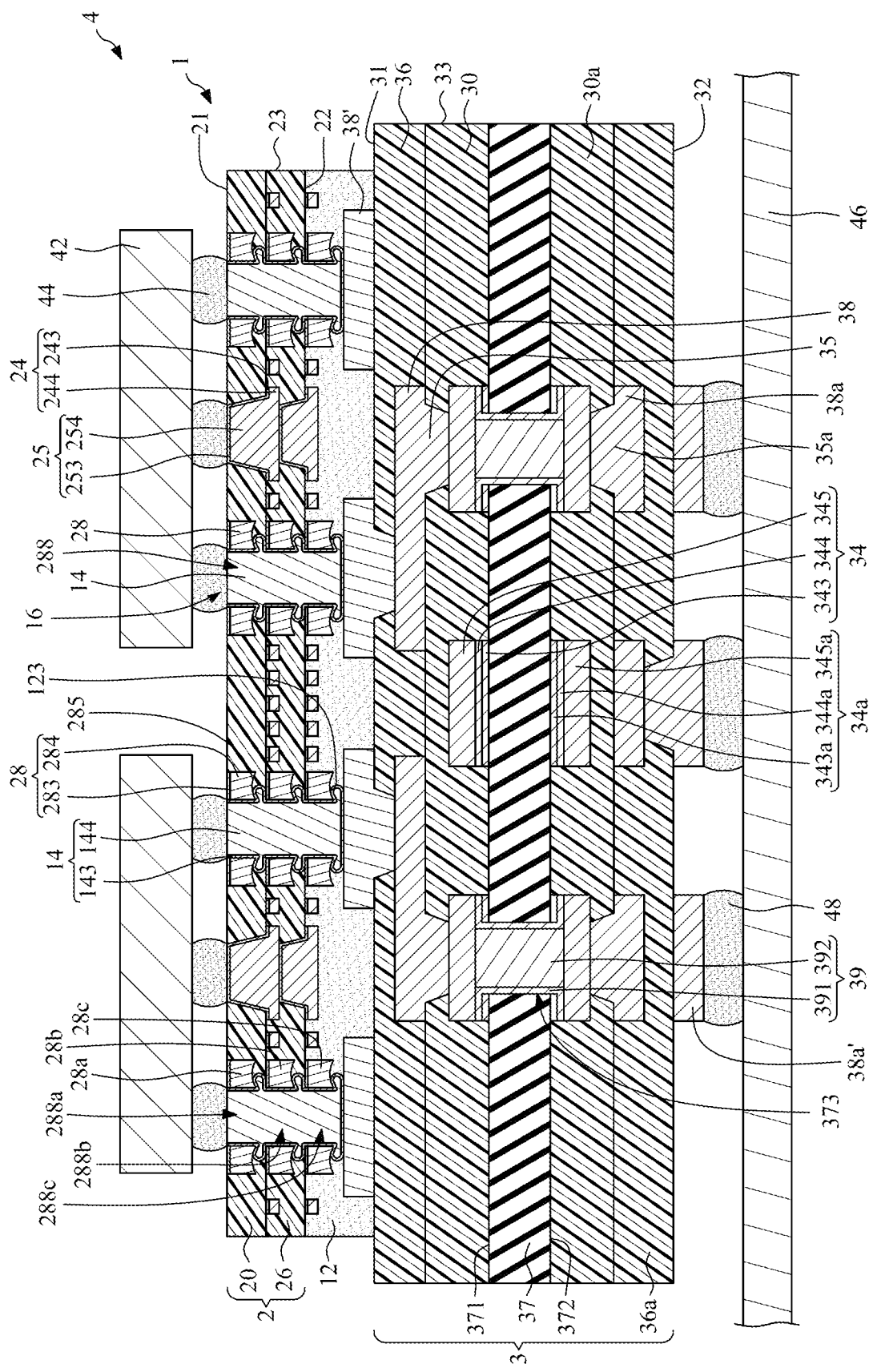
FIG. 6 illustrates a cross-sectional view of a bonding of a package structure and a substrate according to some embodiments of the present disclosure.

FIG. 6 illustrates a cross-sectional view of a bonding of a package structure 4 and a substrate 46 according to some embodiments. The package structure 4 includes a wiring structure 1, a semiconductor chip 42, a plurality of first connecting elements 44 and a plurality of second connecting elements 48. The wiring structure 1 of FIG. 6 is similar to the wiring structure 1 shown in FIG. 1. The semiconductor chip 42 is electrically connected and bonded to the conductive through via(s) 14 and the exposed inner conductive via 25 of the upper conductive structure 2 through the first connecting elements 44 (e.g., solder bumps or other conductive bumps). The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

Figure 7:
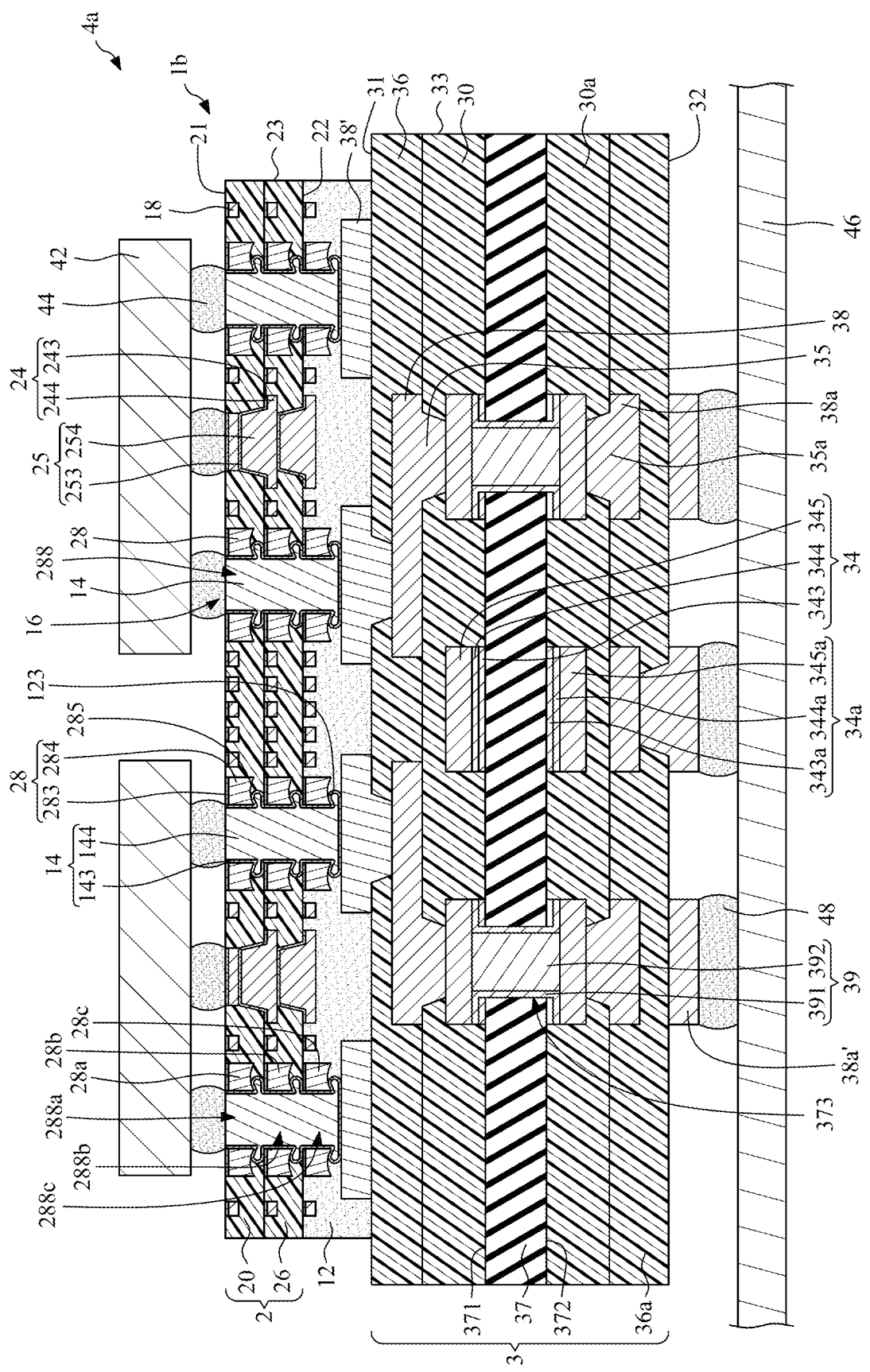
FIG. 7 illustrates a cross-sectional view of a bonding of a package structure and a substrate according to some embodiments of the present disclosure.

FIG. 7 illustrates a cross-sectional view of a bonding of a package structure 4a and a substrate 46 according to some embodiments. The package structure 4a includes a wiring structure 1b, a semiconductor chip 42, a plurality of first connecting elements 44 and a plurality of second connecting elements 48. The wiring structure 1b of FIG. 7 is similar to the wiring structure 1b shown in FIG. 4, except that a plurality of under bump metallurgies (UBMs) 19 are further included. The UBMs 19 are disposed on the exposed portions of the outer circuit layer 18 and the conductive through via(s) 14. The semiconductor chip 42 is electrically connected and bonded to the UBMs 19 through the first connecting elements 44 (e.g., solder bumps or other conductive bumps). The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

Figure 8:
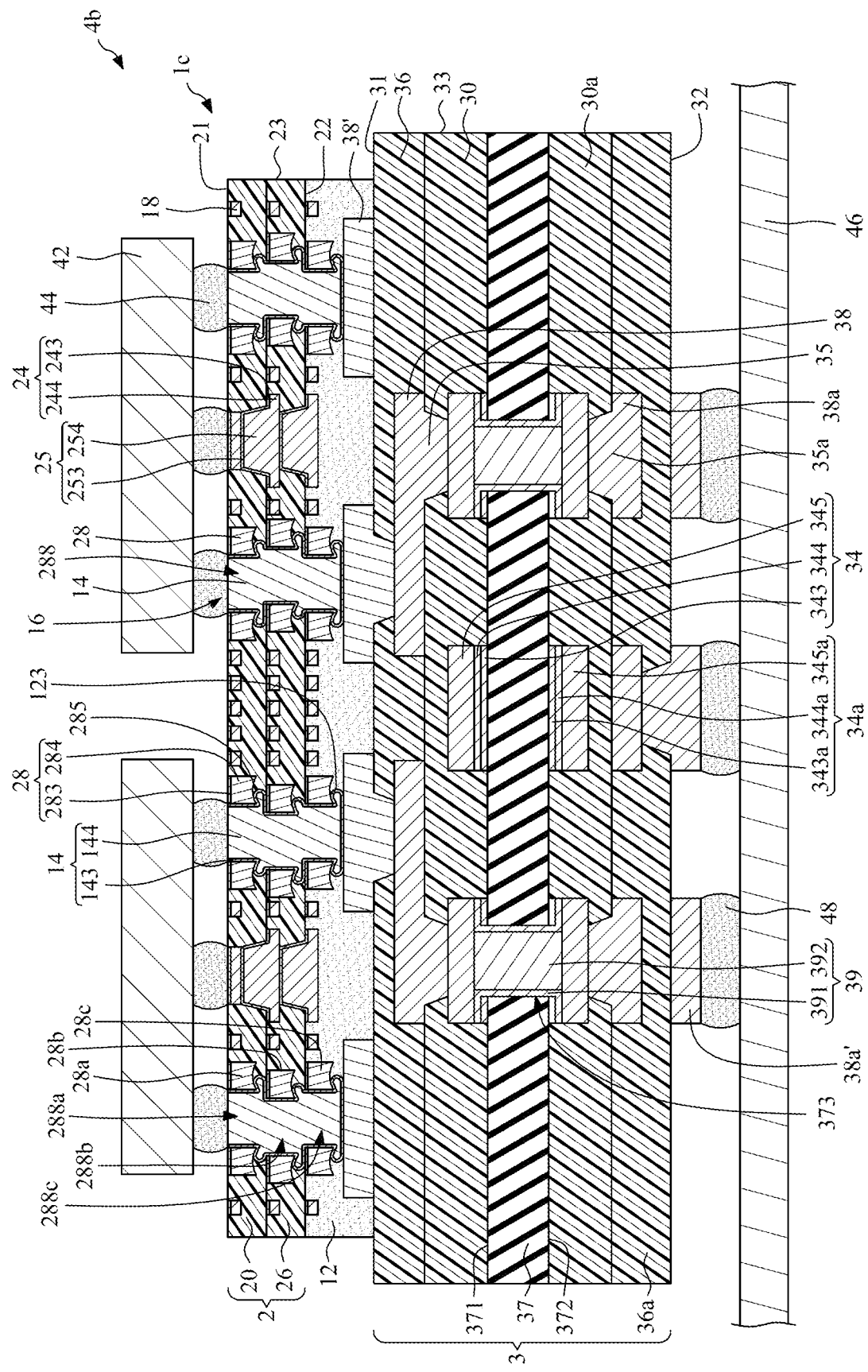
FIG. 8 illustrates a cross-sectional view of a bonding of a package structure and a substrate according to some embodiments of the present disclosure.

FIG. 8 illustrates a cross-sectional view of a bonding of a package structure 4b and a substrate 46 according to some embodiments. The package structure 4b includes a wiring structure 1c, a semiconductor chip 42, a plurality of first connecting elements 44 and a plurality of second connecting elements 48. The wiring structure 1c of FIG. 8 is similar to the wiring structure 1c shown in FIG. 5, except that a plurality of under bump metallurgies (UBMs) 19 are further included. The UBMs 19 are disposed on the exposed portions of the outer circuit layer 18 and the conductive through via(s) 14. The semiconductor chip 42 is electrically connected and bonded to the UBMs 19 through the first connecting elements 44 (e.g., solder bumps or other conductive bumps). The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

FIG. 9 through FIG. 20 illustrate a method for manufacturing a wiring structure according to some embodiments of the present disclosure. In some embodiments, the method is for manufacturing the wiring structure 1 shown in FIG. 1.

Figure 9:
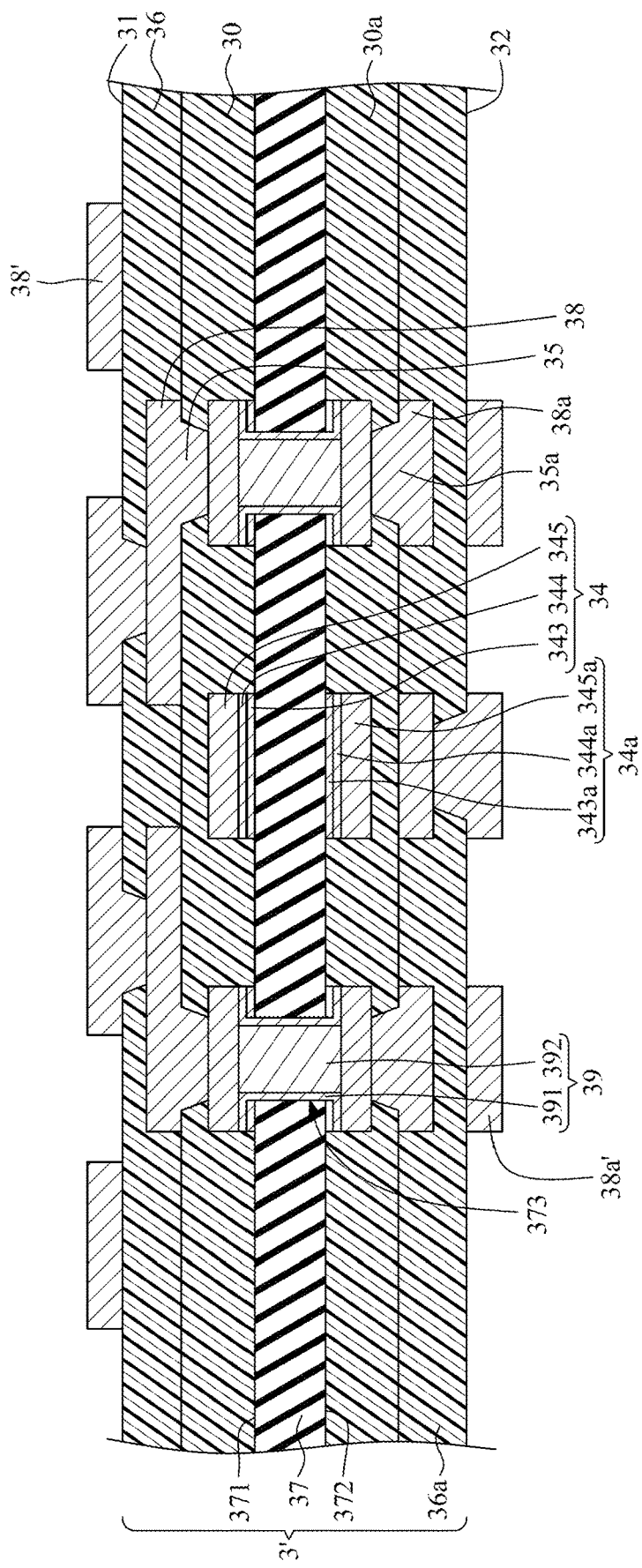
FIG. 9 illustrates one or more stages of an example of a method for manufacturing a wiring structure according to some embodiments of the present disclosure.

Referring to FIG. 9, a lower conductive structure 3' is provided. The lower conductive structure 3' is similar to the lower conductive structure 3 of FIG. 1, and includes the dielectric layers 30, 36, 30a, 36a, the circuit layers 34, 38, 38', 34a, 38a, 38a', the core portion 37, the upper interconnection vias 35 and the lower interconnection vias 35a. An electrical property (such as open circuit/short circuit) of the lower conductive structure 3' may be tested.

Figure 10:
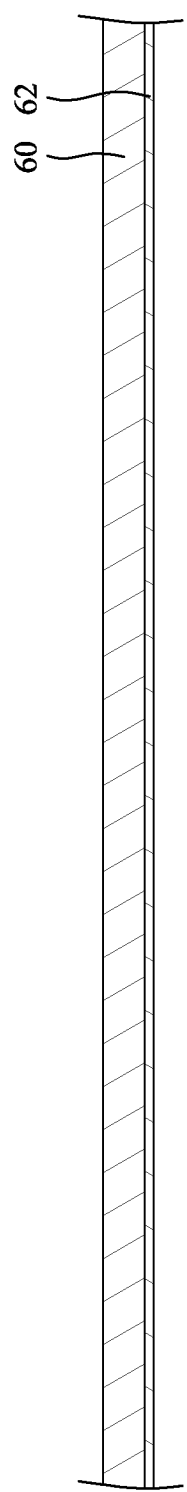
FIG. 10 illustrates one or more stages of an example of a method for manufacturing a wiring structure according to some embodiments of the present disclosure.

Referring to FIG. 10 through FIG. 16, an upper conductive structure 2 is provided. The upper conductive structure 2 is manufactured as follows. Referring to FIG. 10, a carrier 60 with a release layer 62 is provided. The carrier 60 may be a glass carrier, and may be in a wafer type, a panel type or a strip type.

Figure 11:
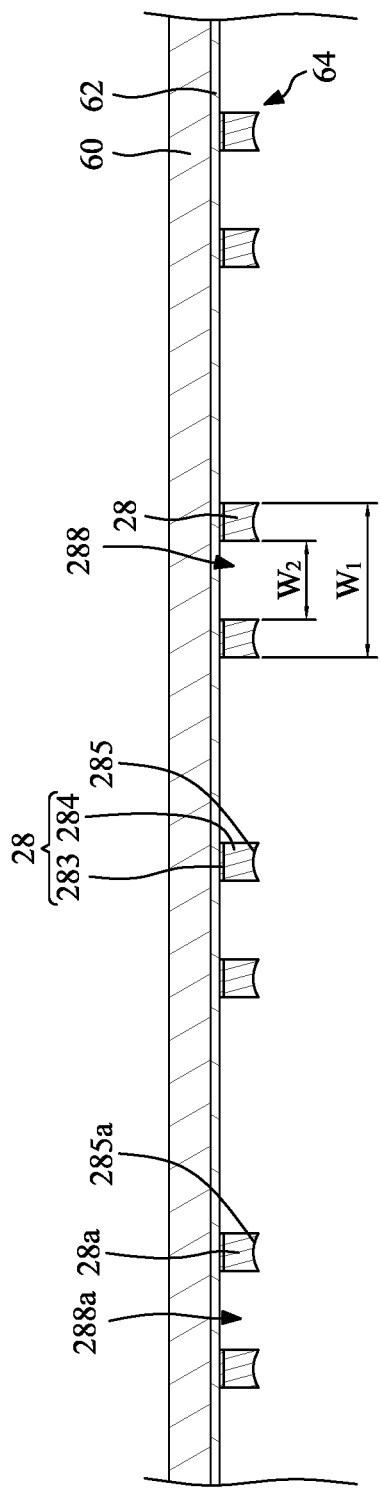
FIG. 11 illustrates one or more stages of an example of a method for manufacturing a wiring structure according to some embodiments of the present disclosure.

Referring to FIG. 11, a first metal layer 64 is formed on the release layer 62 of the carrier 60. The first metal layer 64 may include a plurality of first dam portions 28a and a circuit layer (e.g., the outer circuit layer 18 of FIG. 4). The first dam portion 28a of FIG. 11 is similar to the first dam portion 28a of FIG. 1 and FIG. 2. In some embodiments, the first dam portion 28a may include a seed layer 283 and a conductive material 284 (e.g., a plating metallic material such as copper) disposed on the seed layer 283. The seed layer 283 may be formed by a physical vapor deposition (PVD) technique or other suitable techniques. The conductive material 284 may be formed by a plating technique or other suitable techniques. The conductive material 284 may not taper. Thus, a periphery side surface of the first dam portion 28a may be perpendicular to a surface of the release layer 62 of the carrier 60. The first dam portion 28a may have a substantially consistent width $W_1$. In some embodiments, the conductive material 284 of the first dam portion 28a may include a concave portion (or a concave surface) 285a on an end (e.g., bottom end) thereof since the conductive material 284 may be formed by plating.

Figure 12:
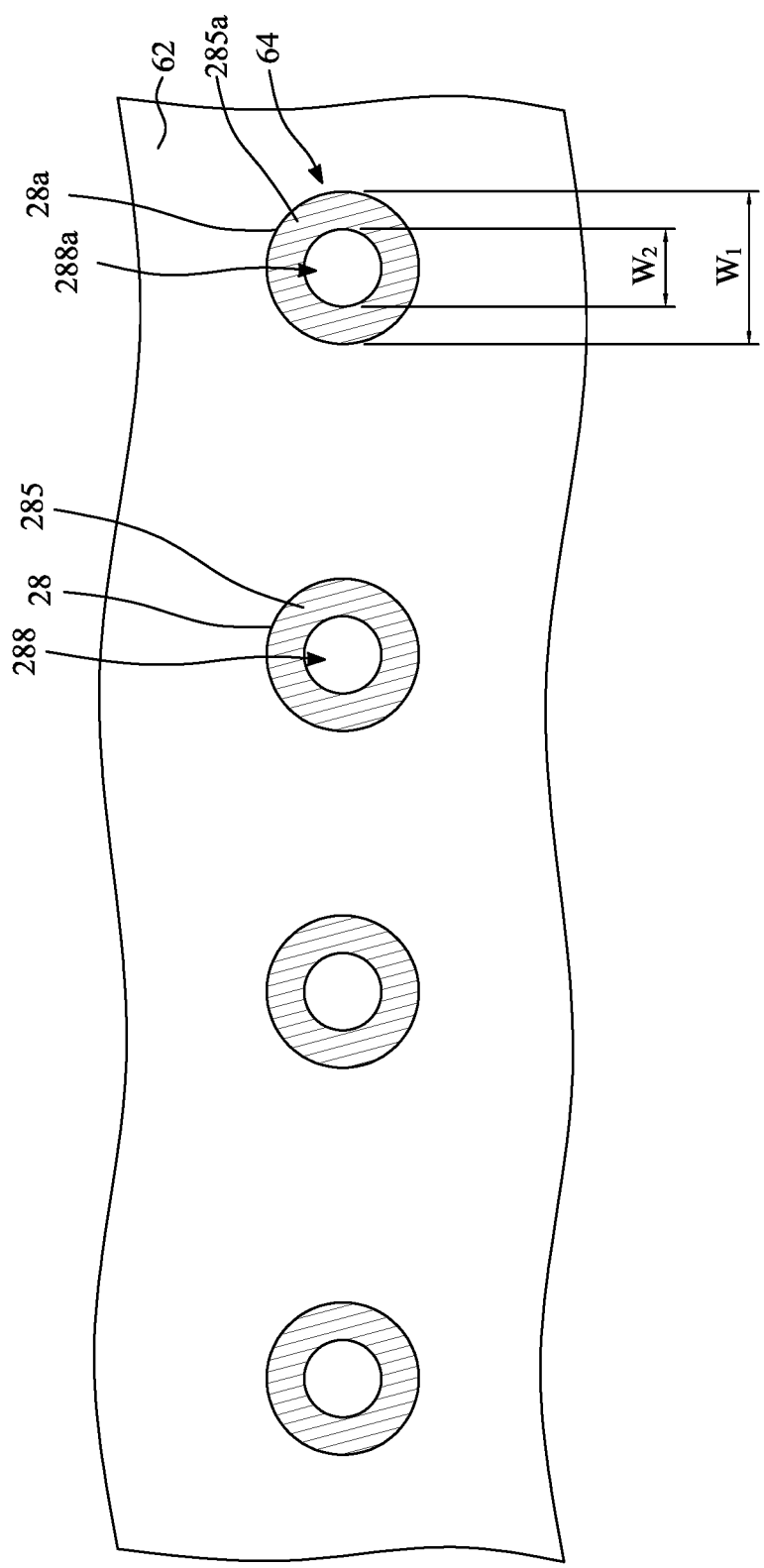
FIG. 12 illustrates one or more stages of an example of a method for manufacturing a wiring structure according to some embodiments of the present disclosure.

Referring to FIG. 12, a partial bottom view of the first metal layer 64 of FIG. 11 is illustrated. As shown in FIG. 12, the first dam portion 28a may be in a substantially closed or complete ring shape, and may define a through hole 288a. The through hole 288a may have a substantially consistent width $W_2$.

Figure 13:
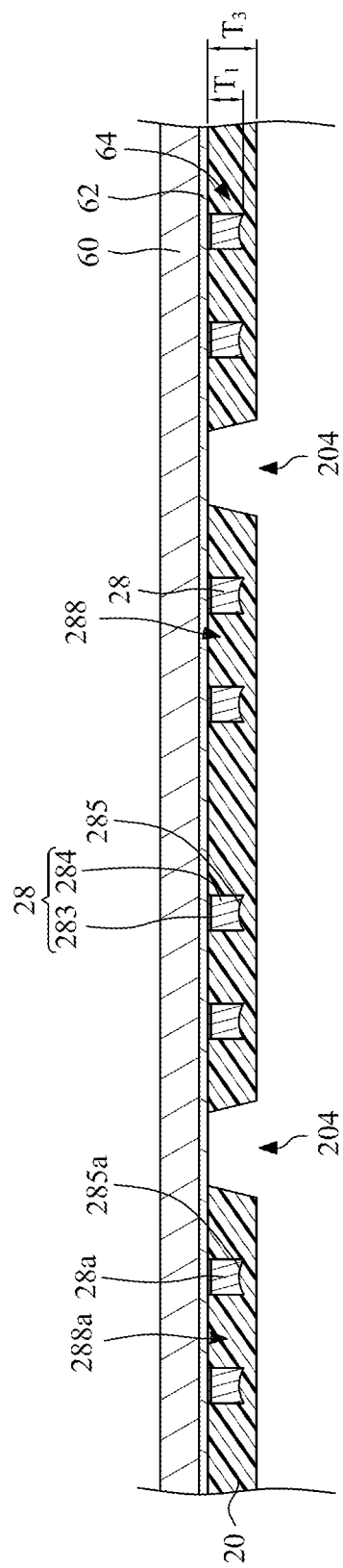
FIG. 13 illustrates one or more stages of an example of a method for manufacturing a wiring structure according to some embodiments of the present disclosure.

Referring to FIG. 13, a first dielectric layer 20 is formed or disposed on the release layer 62 of the carrier 60 to cover the first metal layer 64 (including the first dam portions 28a). That is, a thickness T3 of the first dielectric layer 20 is greater than a thickness T1 of the first dam portion 28a. Thus, the first dielectric layer 20 covers the concave portion 285a of the first dam portion 28a. It is noted that a portion of the first dielectric layer 20 may enter and fill the through hole 288a of the first dam portion 28a. The first dielectric layer 20 has a first surface 201. Since the first dielectric layer 20 may be formed by coating, the first surface 201 that covers the concave portion 285a may have an excellent flatness and excellent surface smoothness. That is, the first surface 201 of the first dielectric layer 20 is very even. Therefore, during a subsequent manufacturing process, a next dam portion (e.g., a second dam portion 28b) may be disposed on the even first surface 201 of the first dielectric layer 20 rather than on the uneven concave portion 285a of the first dam portion 28a. Thus, a tilt of the next dam portion (e.g., the second dam portion 28b) may be prevented or avoided. That is, the next dam portion (e.g., the second dam portion 28b) may stand straightly on the even first surface 201 of the first dielectric layer 20.

Then, the first dielectric layer 20 is patterned to define at least one first opening 204 to expose a portion of the release layer 62 of the carrier 60.

Figure 14:
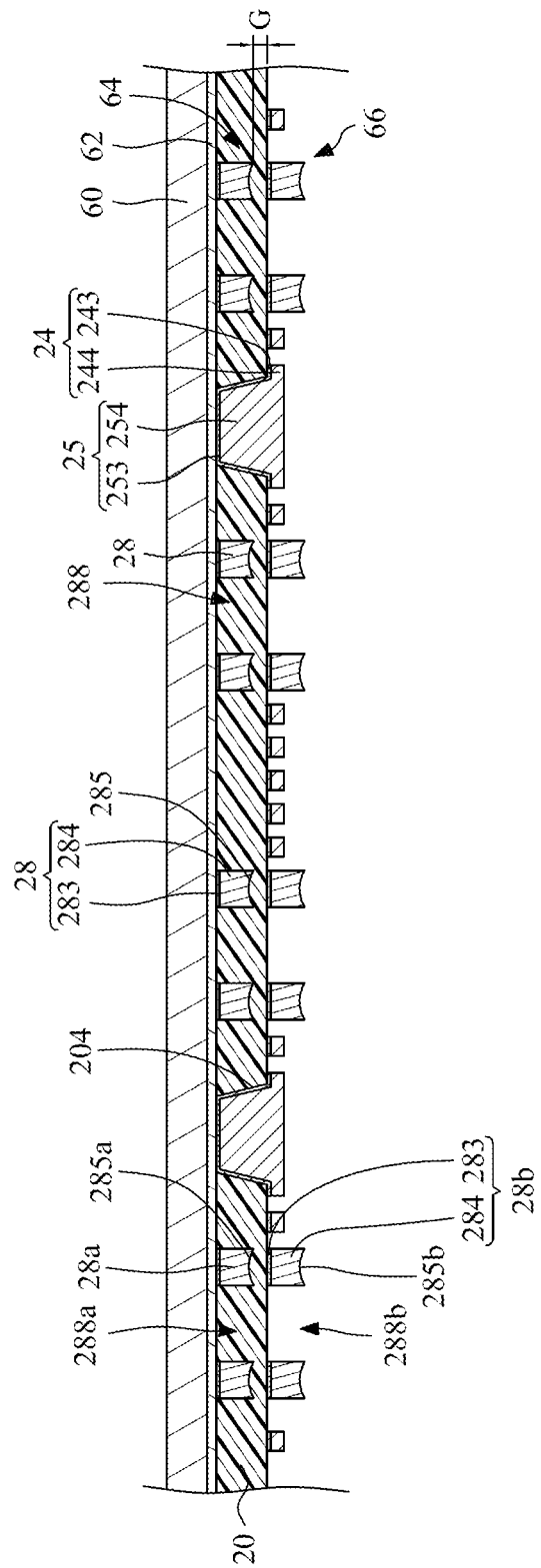
FIG. 14 illustrates one or more stages of an example of a method for manufacturing a wiring structure according to some embodiments of the present disclosure.

Referring to FIG. 14, a second metal layer 66 is formed on the first dielectric layer 20 and in the first opening 204 of the first dielectric layer 20. The second metal layer 66 may include a plurality of second dam portions 28b, a circuit layer 24 and at least one inner conductive via 25. The second dam portion 28b of FIG. 14 is similar to the second dam portion 28b of FIG. 1 and FIG. 2, and is formed or disposed on the first surface 201 of the first dielectric layer 20. In some embodiments, the second dam portion 28b may include a seed layer 283 and a conductive material 284 (e.g., a plating metallic material such as copper) disposed on the seed layer 283. The seed layer 283 may be formed by a physical vapor deposition (PVD) technique or other suitable techniques. The conductive material 284 may be formed by a plating technique or other suitable techniques. The conductive material 284 may not taper. Thus, a periphery side surface of the second dam portion 28b may be perpendicular to the first surface 201 of the first dielectric layer 20. This is because the portion of the first dielectric layer 20 on the concave portion 285a of the first dam portion 28a may compensate the non-flatness of the concave portion 285a.

The position of the second dam portion 28b may correspond to the position of the first dam portion 28a. However, the second dam portion 28b may not contact the first dam portion 28a. In some embodiments, the second dam portion 28b is spaced apart from the first dam portion 28a by a gap G. The second dam portion 28b may have a substantially consistent width that is substantially equal to the width $W_1$ of the first dam portion 28a. In some embodiments, the conductive material 284 of the second dam portion 28b may include a concave portion (or a concave surface) 285b on an end (e.g., bottom end) thereof since the conductive material 284 may be formed by plating. The second dam portion 28b may be in a substantially closed or complete ring shape, and may define a through hole 288b. The through hole 288b of the second dam portion 28b may have a substantially consistent width that is substantially equal to the width $W_2$ of the through hole 288a of the first dam portion 28a.

The circuit layer 24 is formed or disposed on the first surface 201 of the first dielectric layer 20. In some embodiments, the circuit layer 24 may include a seed layer 243 and a conductive material 244 (e.g., a plating metallic material) disposed on the seed layer 243. The seed layer 243 may be formed by a physical vapor deposition (PVD) technique or other suitable techniques. The conductive material 244 may be formed by a plating technique or other suitable techniques. In addition, the inner conductive via 25 is formed or disposed in the first opening 204 of the first dielectric layer 20 to contact the release layer 62 of the carrier 60. In some embodiments, the inner conductive via 25 may include a seed layer 253 and a conductive material 254 (e.g., a plating metallic material) disposed on the seed layer 253. The inner conductive via 25 may taper. In some embodiments, the inner conductive via 25 and the circuit layer 24 may be formed concurrently and integrally. In some embodiments, the seed layer 283 of the second dam portion 28b, the seed layer 243 of the circuit layer 24 and the seed layer 253 of the inner conductive via 25 may be formed from a same seed layer.

Figure 15:
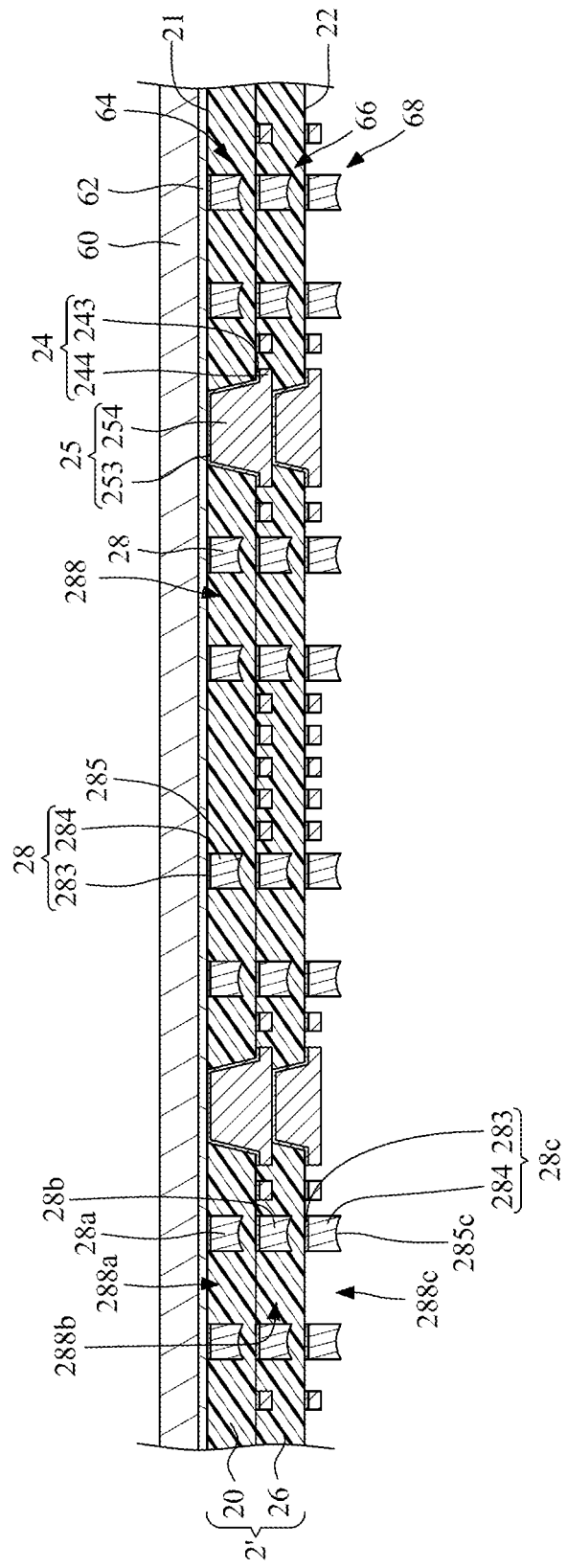
FIG. 15 illustrates one or more stages of an example of a method for manufacturing a wiring structure according to some embodiments of the present disclosure.

Referring to FIG. 15, the stages of FIG. 13 and FIG. 14 are repeated so as to form or dispose a second dielectric layer 26 and a third metal layer 68. The second dielectric layer 26 is disposed on the first dielectric layer 20 to cover the second metal layer 66 (including the second dam portions 28b). Thus, the second dielectric layer 26 covers the concave portion 285b of the second dam portion 28b. It is noted that a portion of the second dielectric layer 26 may enter and fill the through hole 288b of the second dam portion 28b. Then, the second dielectric layer 26 is patterned to define at least one second opening 264 to expose a portion of the circuit layer 24.

Then, the third metal layer 68 is formed on the second dielectric layer 26 and in the second opening 264 of the second dielectric layer 26. The third metal layer 68 may include a plurality of third dam portions 28c, a circuit layer 24 and at least one inner conductive via 25. The third dam portion 28c of FIG. 15 is similar to the third dam portion 28c of FIG. 1 and FIG. 2. In some embodiments, the third dam portion 28c may include a seed layer 283 and a conductive material 284 disposed on the seed layer 283. The conductive material 284 may not taper. Thus, a periphery side surface of the third dam portion 28c may be perpendicular to a surface of the second dielectric layer 26.

The position of the third dam portion 28c may correspond to the position of the second dam portion 28b. However, the third dam portion 28c may not contact the second dam portion 28c. In some embodiments, the conductive material 284 of the third dam portion 28c may include a concave portion (or a concave surface) 285c on an end (e.g., bottom end) thereof. The third dam portion 28c may be in a substantially closed or complete ring shape, and may define a through hole 288c. The through hole 288c of the third dam portion 28c may have a substantially consistent width.

The circuit layer 24 is formed or disposed on the surface of the second dielectric layer 26. In some embodiments, the circuit layer 24 may include a seed layer 243 and a conductive material 244 disposed on the seed layer 243. In addition, the inner conductive via 25 is formed or disposed in the second opening 264 of the second dielectric layer 26 to contact the circuit layer 24 of FIG. 14. In some embodiments, the inner conductive via 25 may include a seed layer 253 and a conductive material 254 disposed on the seed layer 253.

Meanwhile, an upper conductive structure 2' is formed on the carrier 60. The upper conductive structure 2' may be tested.

Figure 16:
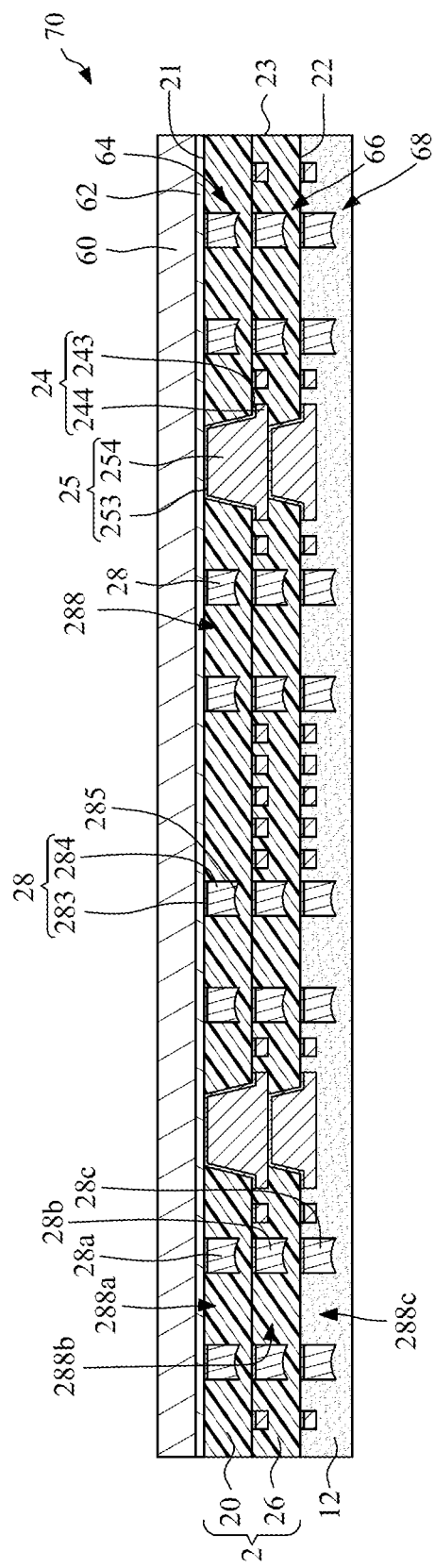
FIG. 16 illustrates one or more stages of an example of a method for manufacturing a wiring structure according to some embodiments of the present disclosure.

Referring to FIG. 16, an adhesive layer 12 is formed or applied on the upper conductive structure 2' to cover the third metal layer 68 (including the third dam portions 28c). It is noted that a portion of the adhesive layer 12 may enter and fill the through hole 288c of the third dam portion 28c. Then, the upper conductive structure 2', the carrier 60 and the adhesive layer 12 are cut to form a plurality of unit structures 70. The unit structure 70 includes an upper conductive structure 2, a portion of the carrier 60 and an adhesive layer 12. The upper conductive structure 2 of FIG. 16 may be the upper conductive structure 2 of FIG. 1.

Figure 17:
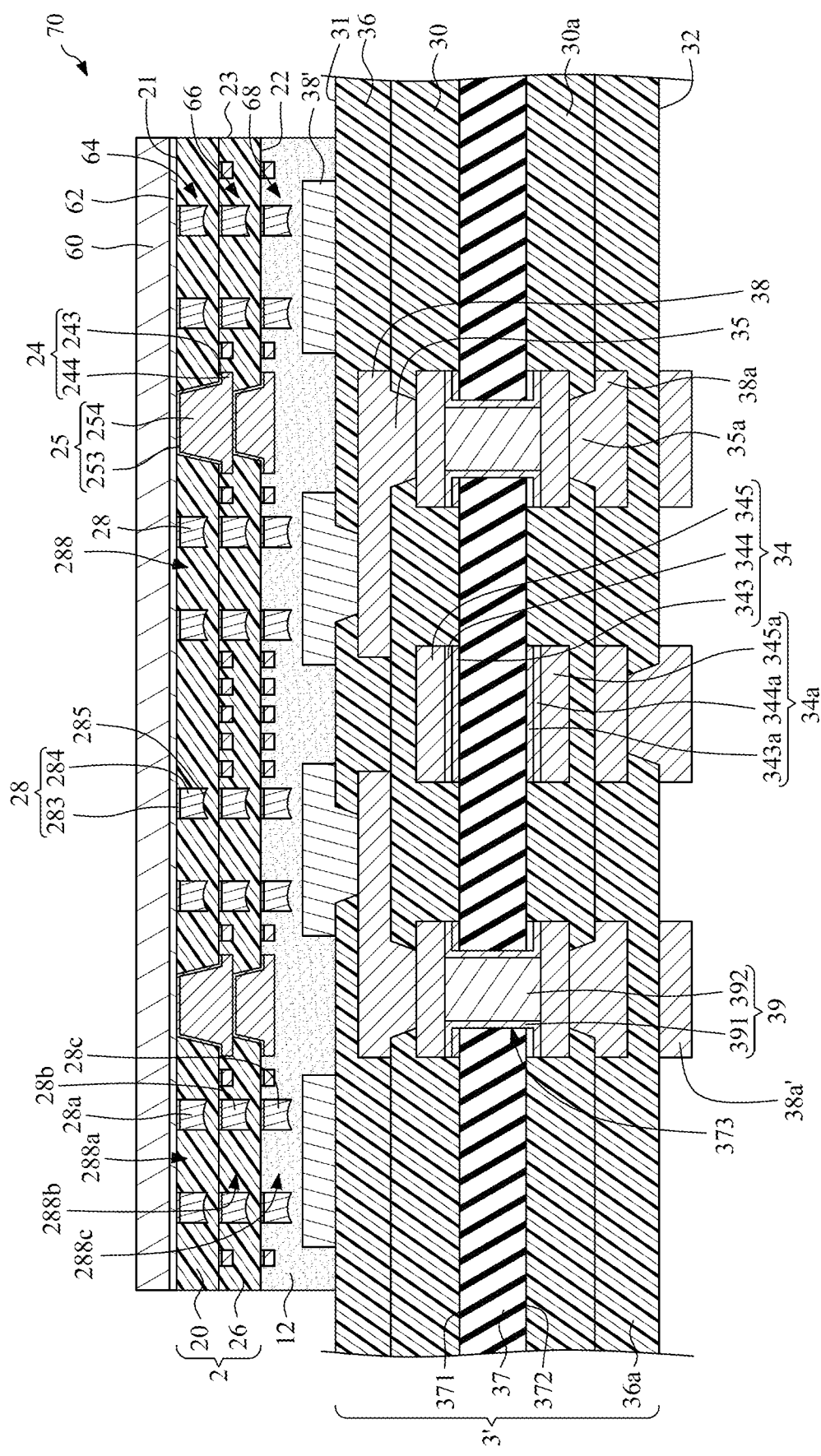
FIG. 17 illustrates one or more stages of an example of a method for manufacturing a wiring structure according to some embodiments of the present disclosure.

Referring to FIG. 17, the unit structure 70 is attached to the lower conductive structure 3' of FIG. 9. The upper conductive structure 2 faces the lower conductive structure 3'. Thus, the upper conductive structure 2 and the carrier 60 are attached to the lower conductive structure 3' through the adhesive layer 12. Then, the adhesive layer 12 is cured to form an intermediate layer 12.

Figure 18:
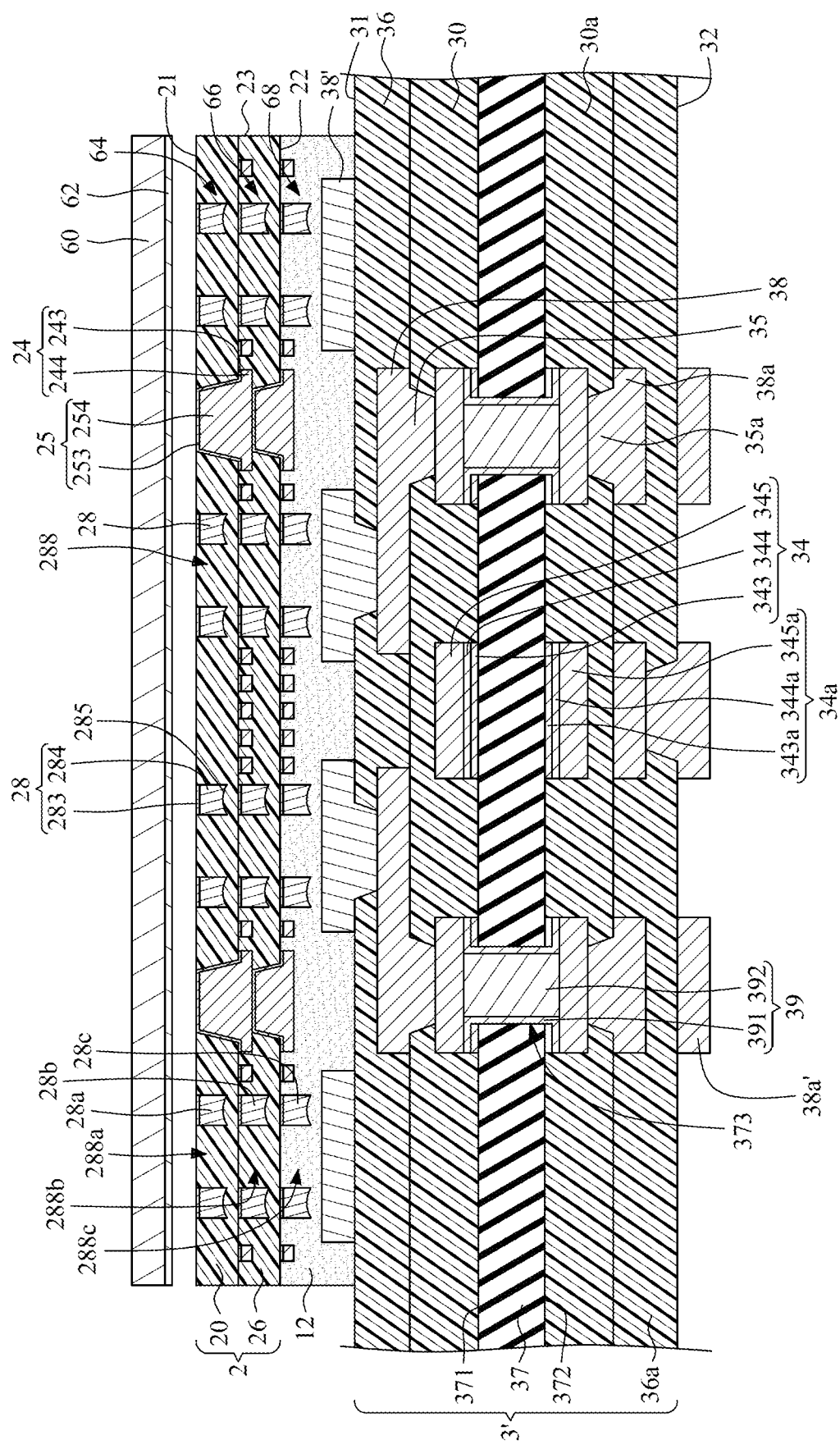
FIG. 18 illustrates one or more stages of an example of a method for manufacturing a wiring structure according to some embodiments of the present disclosure.

Referring to FIG. 18, the carrier 60 and the release layer 62 are removed.

Figure 19:
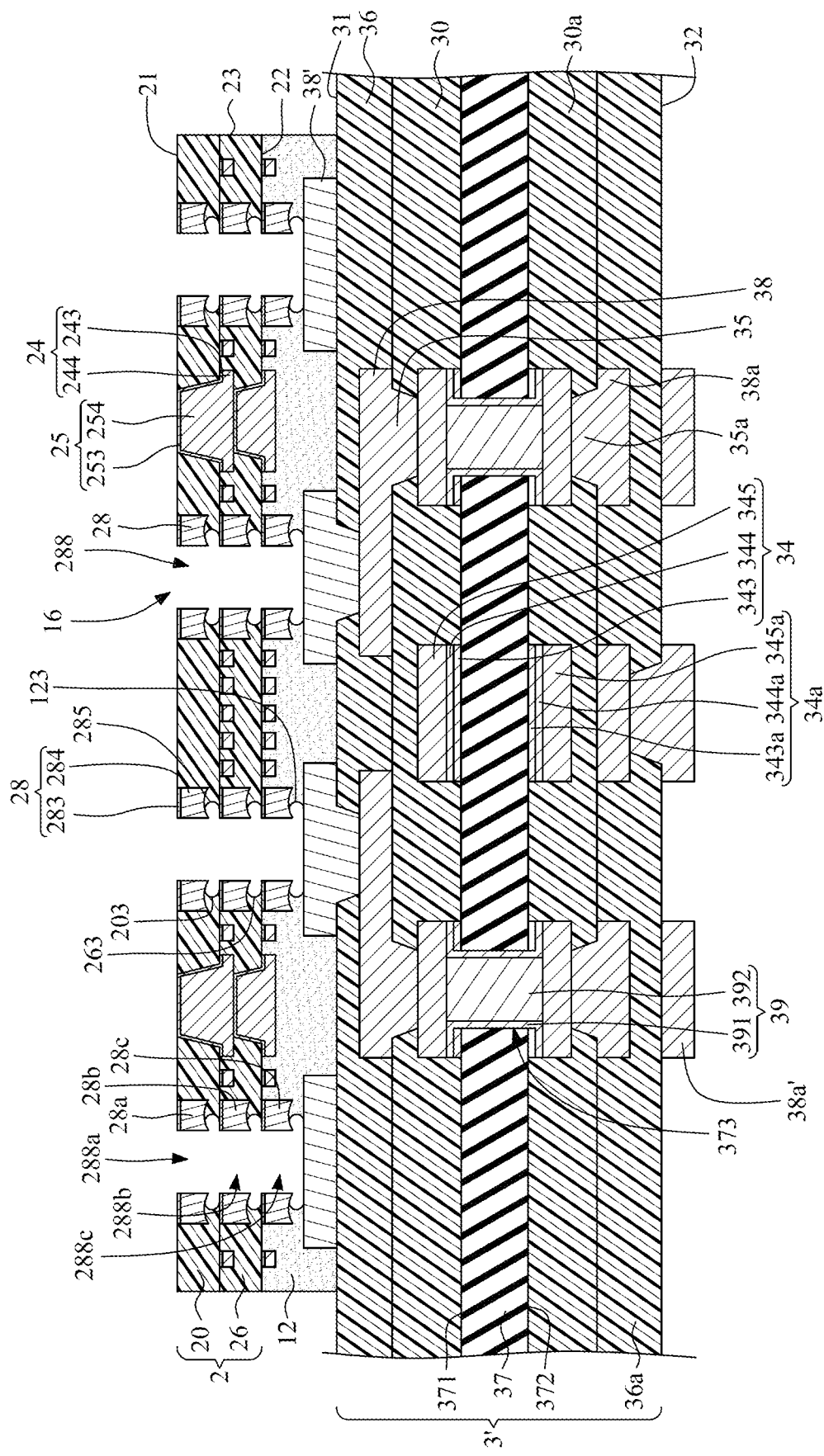
FIG. 19 illustrates one or more stages of an example of a method for manufacturing a wiring structure according to some embodiments of the present disclosure.

Referring to FIG. 19, a portion of the first dielectric layer 20 in the through hole 288a of the first dam portion 28a, a portion of the second dielectric layer 26 in the through hole 288b of the second dam portion 28b, and a portion of the intermediate layer 12 in and under the through hole 288c of the third dam portion 28c are removed to form an accommodating hole 16 through plasma dry etching. Meanwhile, the recess portions 203, 263 of the dielectric layers 20, 26 in the gaps G and the through hole 123 of the intermediate layer 12 are formed. A portion of the topmost circuit layer (e.g., the top surface of the second upper circuit layer 38') of the lower conductive structure 3' is exposed.

Figure 20:
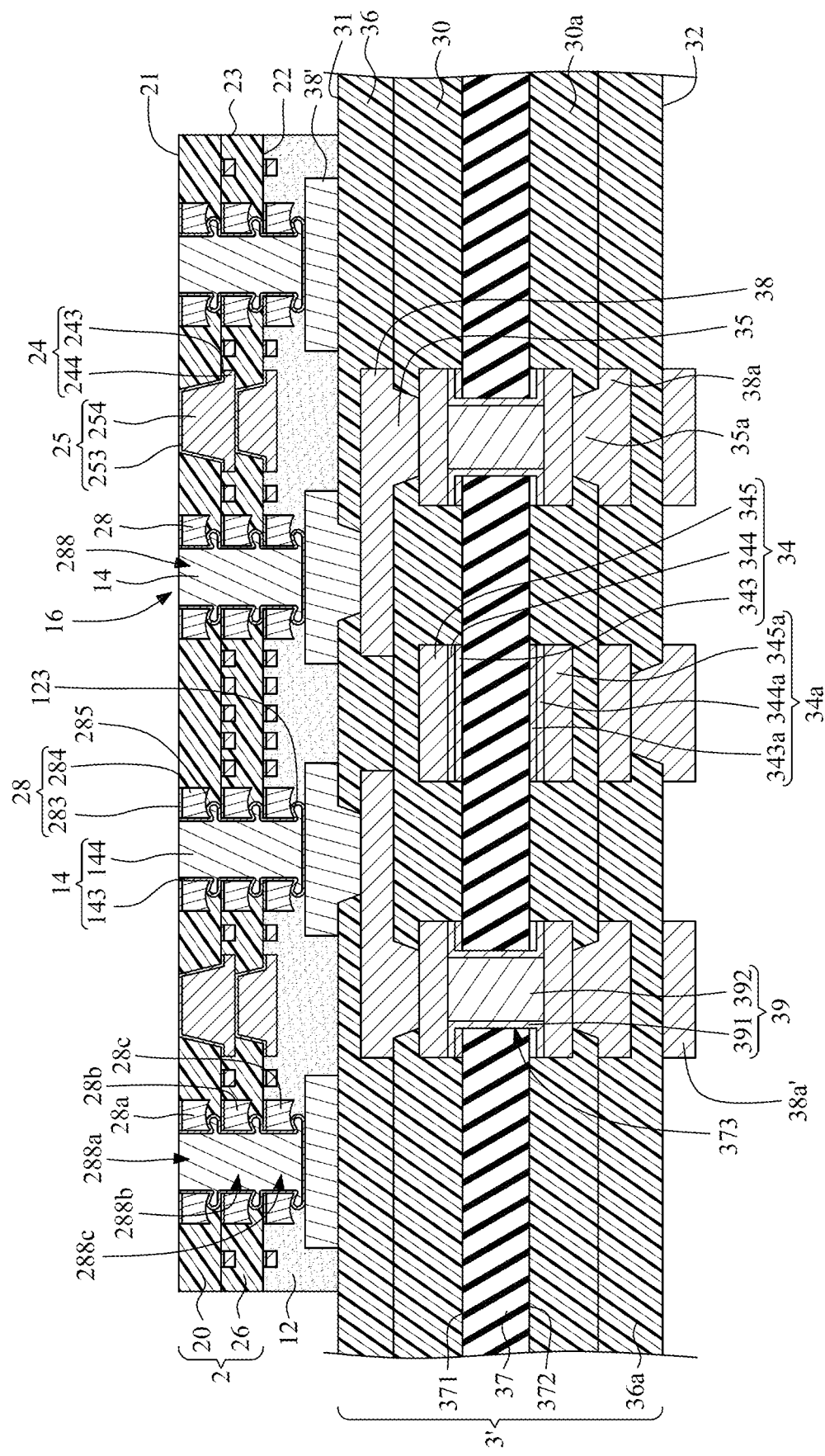
FIG. 20 illustrates one or more stages of an example of a method for manufacturing a wiring structure according to some embodiments of the present disclosure.

Referring to FIG. 20, a seed layer 143 is formed or disposed on the sidewall of the accommodating hole 16 and the through hole 123 of the intermediate layer 12. Then, a conductive material 144 (e.g., a metallic material) is formed or disposed to fill the accommodating hole 16 and the through hole 123 of the intermediate layer 12 through, for example, plating, so as to form a conductive through via 14 in the accommodating hole 16 and the through hole 123 of the intermediate layer 12. The conductive through via 14 extends through the dam portions 28 (e.g., the first dam portion 28a, the second dam portion 28b and the third dam portion 28c), and contacts a portion of the topmost circuit layer (e.g., the top surface of the second upper circuit layer 38') of the lower conductive structure 3'.

Then, the lower conductive structure 3' is singulated so as to obtain the wiring structure 1 of FIG. 1.

Since a width and a profile of the accommodating hole 16 are defined and limited by the solid portions of the dam portions 28. As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a conductive structure including a plurality of dielectric layers, a plurality of circuit layers in contact with the dielectric layers, and a plurality of dam portions in contact with the dielectric layers, wherein the dam portions are substantially arranged in a row and spaced apart from one another; and
   at least one conductive through via extending through the dam portions;
   wherein the dielectric layer defines a recess portion in a gap between two of the dam portions.

2. The wiring structure of claim 1, wherein a portion of the conductive through via extends into the recess portion.

3. The wiring structure of claim 1, wherein the conductive through via includes a seed layer and a conductive material, the seed layer is interposed between the conductive material and the dam portions, and a portion of the seed layer is disposed in the recess portion.

4. The wiring structure of claim 1, wherein the dam portion defines a through hole, and the at least one conductive through via is disposed in the through hole of the dam portion.

5. The wiring structure of claim 1, wherein the dam portion is in a substantially closed ring shape.

6. The wiring structure of claim 1, wherein the dam portions are electrically isolated from the circuit layers.

7. The wiring structure of claim 1, wherein a thickness of the dam portion is greater than a thickness of the circuit layer.

8. The wiring structure of claim 1, wherein a thickness of the dam portion is less than a thickness of the dielectric layer.

9. The wiring structure of claim 1, wherein the dam portions are misaligned with one another.

10. The wiring structure of claim 1, wherein a sidewall of the recess portion of the dielectric layer is curved.

11. The wiring structure of claim 1, further comprising an outer circuit layer embedded in a topmost dielectric layer of the conductive structure, and being exposed from a top surface of the conductive structure.

12. A wiring structure, comprising:
   a lower conductive structure including at least one dielectric layer and at least one circuit layer in contact with the dielectric layer;
   an upper conductive structure disposed on the lower conductive structure, wherein the upper conductive structure includes a plurality of dielectric layers, a plurality of circuit layers in contact with the dielectric layers, and a plurality of dam portions in contact with the dielectric layers, wherein the dam portions are substantially arranged in a row and spaced apart from one another; and
   at least one conductive through via extending through the dam portions and the upper conductive structure, and terminating on the circuit layer of the lower conductive structure;

wherein the dam portion includes a concave portion on an end thereof, and the dielectric layer covers the concave portion.

13. The wiring structure of claim 12, wherein a length of the conductive through via is greater than a thickness of the upper conductive structure.

14. The wiring structure of claim 12, wherein a lateral surface of the lower conductive structure is displaced from a lateral surface of the upper conductive structure.

15. The wiring structure of claim 12, wherein a line space of the circuit layer of the lower conductive structure is greater than a line space of the circuit layer of the upper conductive structure.

16. The wiring structure of claim 12, further comprising:
an intermediate layer disposed between the upper conductive structure and the lower conductive structure and bonding the upper conductive structure and the lower conductive structure together, wherein the conductive through via further extends through the intermediate layer.

17. The wiring structure of claim 12, wherein a topmost circuit layer of the lower conductive structure and a bottommost circuit layer of the upper conductive structure are embedded in the intermediate layer.

* * * * *